(12) United States Patent
Bonart

(10) Patent No.: US 9,318,485 B2
(45) Date of Patent: Apr. 19, 2016

(54) CAPACITOR ARRANGEMENTS AND METHOD FOR MANUFACTURING A CAPACITOR ARRANGEMENT

(75) Inventor: Dietrich Bonart, Bad Abbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 580 days.

(21) Appl. No.: 13/571,453

(22) Filed: Aug. 10, 2012

(65) Prior Publication Data

US 2014/0042591 A1 Feb. 13, 2014

(51) Int. Cl.
*H01L 29/66* (2006.01)
*H01L 29/93* (2006.01)
*H01L 29/861* (2006.01)
*H01L 27/08* (2006.01)
*H01L 29/872* (2006.01)
*H01L 29/94* (2006.01)
*H01L 27/06* (2006.01)
*H01L 29/16* (2006.01)

(52) U.S. Cl.
CPC ........ *H01L 27/0805* (2013.01); *H01L 27/0811* (2013.01); *H01L 29/66181* (2013.01); *H01L 29/861* (2013.01); *H01L 29/872* (2013.01); *H01L 29/93* (2013.01); *H01L 29/94* (2013.01); *H01L 27/0629* (2013.01); *H01L 29/1608* (2013.01)

(58) Field of Classification Search
CPC ............... H01L 29/92–29/94; H01L 27/0805; H01L 29/872; H01L 29/861
USPC .................. 257/532, 595, 598, 601, E29.344; 438/379
See application file for complete search history.

(56) References Cited

U.S. PATENT DOCUMENTS

| 3,612,964 | A | * | 10/1971 | Kawazu | ................... H01L 29/93 257/312 |
| 3,890,635 | A | * | 6/1975 | Engeler | ................. H01L 27/088 257/312 |
| 7,030,457 | B2 | | 4/2006 | Ahrens et al. | |
| 8,610,248 | B2 | | 12/2013 | Liang et al. | |
| 2001/0042879 | A1 | * | 11/2001 | Ghilardelli | .............. H01L 29/94 257/296 |
| 2003/0183866 | A1 | * | 10/2003 | Sanchez | ................... H01L 29/93 257/312 |
| 2005/0013090 | A1 | | 1/2005 | Ahrens et al. | |
| 2005/0067674 | A1 | | 3/2005 | Maget | |

(Continued)

FOREIGN PATENT DOCUMENTS

| CN | 1431696 A | 7/2003 |
| CN | 1596463 A | 3/2005 |
| CN | 102148261 A | 8/2011 |

(Continued)

*Primary Examiner* — Marvin Payen
*Assistant Examiner* — Jeremy Joy

(57) ABSTRACT

In various embodiments, a capacitor arrangement is provided, which may include a substrate; a plurality of first doped regions and a plurality of second doped regions, wherein the first doped regions are doped with dopants of a first conductivity type and the second doped regions are doped with dopants of a second conductivity type being opposite to the first conductivity type, and wherein the plurality of first doped regions and the plurality of second doped regions are alternatingly arranged next to each other in the substrate; a dielectric layer disposed over the plurality of first doped regions and the plurality of second doped regions; an electrode disposed over the dielectric layer; a first terminal electrically coupled to each doped region of the plurality of first doped regions and the plurality of second doped regions; and a second terminal electrically coupled to the electrode.

13 Claims, 4 Drawing Sheets

(56) References Cited

U.S. PATENT DOCUMENTS

2009/0174030 A1 7/2009 Khan et al.
2011/0233722 A1 9/2011 Liang et al.

FOREIGN PATENT DOCUMENTS

DE 10206375 A1 6/2003
DE 10207739 A1 9/2003

* cited by examiner

CAPACITOR ARRANGEMENTS AND METHOD FOR MANUFACTURING A CAPACITOR ARRANGEMENT

TECHNICAL FIELD

Various embodiments relate generally to capacitor arrangements and a method of manufacturing a capacitor arrangement.

BACKGROUND

Capacitors may be implemented using a so-called metal-oxide-semiconductor (MOS) structure. Such a structure has a dielectric, for example silicon dioxide ($SiO_2$), which is arranged on a semiconductor substrate. A metal electrode or a heavily doped, highly conductive polycrystalline silicon (poly-Si) is arranged on the dielectric. The capacitance between the electrode and the substrate depends on the voltage between the electrode and the substrate. Typically, the capacitance over voltage relationship is highly non-linear. A solution to overcome this problem is to introduce a second layer of polycrystalline silicon to create a so-called poly-poly capacitance. However, this solution has the disadvantages of high process costs and additional failure modes during burn-in and/or over lifetime.

SUMMARY

In various embodiments, a capacitor arrangement is provided, which may include a substrate; a plurality of first doped regions and a plurality of second doped regions, wherein the first doped regions are doped with dopants of a first conductivity type and the second doped regions are doped with dopants of a second conductivity type being opposite to the first conductivity type, and wherein the plurality of first doped regions and the plurality of second doped regions are alternatingly arranged next to each other in the substrate; a dielectric layer disposed over the plurality of first doped regions and the plurality of second doped regions; an electrode disposed over the dielectric layer; a first terminal electrically coupled to each doped region of the plurality of first doped regions and the plurality of second doped regions; and a second terminal electrically coupled to the electrode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
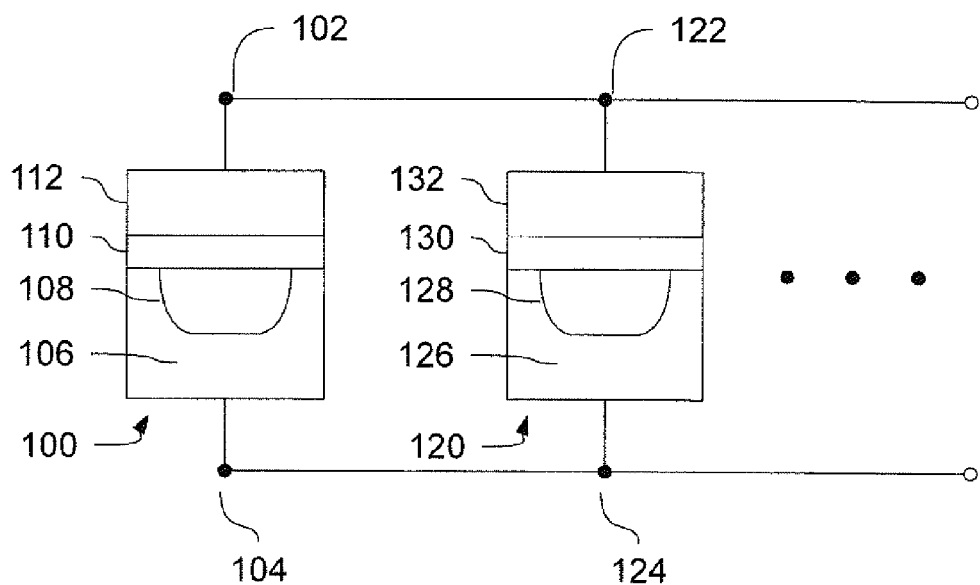
FIG. 1 shows a first embodiment of a capacitor arrangement.

FIG. 1 shows a first capacitor arrangement having a first capacitor 100 and a second capacitor 120. The first capacitor may have a first terminal 102 and a second terminal 104. The second capacitor may have a first terminal 122 and a second terminal 124. The first terminal 102 of the first capacitor 100 may be electrically coupled to the first terminal 122 of the second capacitor 120. The second terminal 104 of the first capacitor 100 may be electrically coupled to the second terminal 124 of the second capacitor 120. The first capacitor 100 and the second capacitor 120 may thus be connected electrically in parallel.

The first capacitor 100 may have a substrate 106, a first well 108 (in general, a first doped region doped with dopants of a first conductivity type (e.g. n conductivity type or p conductivity type)), a dielectric 110 and an electrode 112. The first well 108 may be formed in the substrate 106. The dielectric 110 may be disposed over at least the first well 108. It may also be disposed over the substrate 106. The dielectric 110 may cover all of the first well 108. The electrode 112 may be arranged on at least the dielectric 110. The electrode 112 may be doped with a first dopant with a first dopant concentration, e.g. with a dopant concentration in the range from about $1 \cdot 10^{18}$ cm$^{-3}$ to about $1 \cdot 10^{20}$ cm$^{-3}$, e.g. in the range from about $5 \cdot 10^{18}$ cm$^{-3}$ to about $5 \cdot 10^{19}$ cm$^{-3}$, e.g. about $1 \cdot 10^{19}$ cm$^{-3}$. The first well 108 may be doped with a second dopant with a second concentration, e.g. with a well dopant concentration, e.g. with a dopant concentration in the range from about $1 \cdot 10^{16}$ cm$^{-3}$ to about $1 \cdot 10^{18}$ cm$^{-3}$, e.g. in the range from about $5 \cdot 10^{16}$ cm$^{-3}$ to about $5 \cdot 10^{17}$ cm$^{-3}$, e.g. about $1 \cdot 10^{17}$ cm$^{-3}$. The first capacitor 100 may be a semiconductor capacitor and may have a first capacitance to voltage relationship. The first capacitance to voltage relationship may have a first flatband voltage.

The second capacitor 120 may have a substrate 126, a second well 128 (in general, a second doped region doped with dopants of a second conductivity type (e.g. n conductivity type or p conductivity type)), a dielectric 130 and an electrode 132. The second well 128 may be formed in the substrate 126. The dielectric 130 may be disposed over at least the second well 128. It may also be disposed over the substrate 126. The dielectric 130 may cover all of the second well 128. The electrode 132 may be disposed over at least the dielectric 130. The electrode 132 may be doped with a third dopant with a third concentration, e.g. with a dopant concentration in the range from about $1 \cdot 10^{18}$ cm$^{-3}$ to about $1 \cdot 10^{20}$ cm$^{-3}$, e.g. in the range from about $5 \cdot 10^{18}$ cm$^{-3}$ to about $5 \cdot 10^{19}$ cm$^{-3}$, e.g. about $1 \cdot 10^{19}$ cm$^{-3}$. The third dopant may be of the second conductivity type and may be the same dopant as the second dopant or a different dopant of the second conductivity type. The second well 128 may be doped with a fourth dopant with a fourth concentration, e.g. with a well dopant concentration, e.g. with a dopant concentration in the range from about $1 \cdot 10^{16}$ cm$^{-3}$ to about $1 \cdot 10^{18}$ cm$^{-3}$, e.g. in the range from about $5 \cdot 10^{16}$ cm$^{-3}$ to about $5 \cdot 10^{17}$ cm$^{-3}$, e.g. about $1 \cdot 10^{17}$ cm$^{-3}$. The fourth dopant may be of the first conductivity type and may be the same dopant as the first dopant or a different dopant of the first conductivity type. The second capacitor 120 may be a semiconductor capacitor and may have a second capacitance to voltage relationship. The second capacitance to voltage relationship may have a second flatband voltage. The second flatband voltage may be different from the first flatband voltage.

As the first capacitor 100 and the second capacitor 120 may have flatband voltages that differ from each other, their capacitance to voltage relationships will also differ from each other. The parallel electrical connection of the first capacitor 100 and the second capacitor 120 causes their capacitance to voltage relationships to be added. It will lead to a new capacitance to voltage relationship by means of superposition. The non-linearity of the capacitance over voltage relationship of the individual first capacitor 100 or second capacitor 120 may be compensated by choosing the first flatband voltage and the second flatband voltage so that a desired new capacitance to voltage relationship is obtained by superposition.

While only two capacitors 100 and 120 are shown in FIG. 1, the capacitor arrangement may also contain a plurality of capacitors, where the capacitors may be connected electrically in parallel to each other. The capacitors may each have its own capacitance to voltage relationship and its own flatband voltage. However, at least two capacitors have a capacitance to voltage relationship that differs from each other in accordance with various embodiments.

The substrate 106, also called body, may be made of a group IV material, such as silicon, germanium or silicon carbide. If the substrate 106 is already doped to be a p-type semiconductor or an n-type semiconductor, there may not be a need to provide a well 108 in the substrate 106. In this case, the capacitor 100 would have the substrate 106, the dielectric 110 and the electrode 112 without the well 108. However, the well 108 may be used to provide a different type of doping, for example a p-type well 108 in an n-type substrate 106, and may also be used to provide a concentration of impurities that differs from the concentration of impurities in the substrate 106. The well 108 may be doped with a second dopant, such as an acceptor from a group III element, such as boron, indium, aluminum or gallium, or a donor from a group V element, such as phosphorus, arsenic or antimony. The second dopant may have a second concentration, for example, of $10^{15}$ to $5 \cdot 10^{17}$ cm$^{-3}$. The well 106 or the substrate 106 if no well 106 is needed, may be electrically coupled to the second terminal 104.

The dielectric 110 may be an oxide, such as silicon oxide (SiO$_2$), a nitride, such as silicon nitride (Si$_3$N$_4$) or a material with a high dielectric constant k (wherein in various embodiments a high k dielectric material is a dielectric material having a dielectric constant κ of larger than the dielectric constant k of silicon dioxide, e.g. a dielectric material having a dielectric constant k of larger than 3.9), such as silicon oxynitride. The thickness of the dielectric 110 may be between 3 to 50 nm.

The electrode 112 may consist of polycrystalline silicon (poly-Si). The polycrystalline silicon may be heavily doped with a first dopant and may be used as a conducting material.

The first dopant may be an acceptor from a group III element, such as boron, indium, aluminum or gallium to create a p-type semiconductor. Alternatively, the first dopant may be a donor from a group V element, such as phosphorus, arsenic or antimony to create an n-type semiconductor. The first concentration of the first dopant may be 1:104, and depending on the type of dopant, may be referred to and indicated as "n+" or "p+" for an n-type dopant and for a p-type dopant, respectively, in the figures and the description.

What has been said about the first capacitor 100 also applies to the second capacitor 120, with the corresponding reference signs for the first terminal 122, the second terminal 124, the substrate 126, the second well 128, the dielectric 130 and the electrode 132. The electrode 132 is doped with a third dopant with a third concentration instead of a first dopant with a first concentration. However, what was said about the first dopant with the first concentration also applies to the third dopant with the third concentration. The second well 128 is doped with a fourth dopant with a fourth concentration instead of a second dopant with a second concentration. However, what was said about the second dopant with the second concentration also applies to the fourth dopant with the fourth concentration.

The flatband voltage $V_{FB}$ is a voltage between the first terminal 102, 122 and the second terminal 104, 124 at which there is no electric field across the dielectric 110, 150, that is, the energy band in the dielectric 110, 150 is (substantially) flat. The first dopant, the first concentration, the second dopant and the second concentration may be used to set the capacitance to voltage relationship of the first capacitor 100, for example by setting the first flatband voltage. Similarly, the third dopant, the third concentration, the fourth dopant and the fourth concentration may be used to set the capacitance to voltage relationship of the second capacitor 120, for example by setting the second flatband voltage. The first dopant and the second dopant may be the same, may be of the same doping type, that is n-type or p-type, or may be different to each other. The first concentration and the second concentration may be the same or may be different to each other. The third dopant and the fourth dopant may be the same, may be of the same doping type, that is n-type or p-type, or may be different to each other. The third concentration and the fourth concentration may be the same or may be different to each other. The first dopant and the third dopant may be the same, may be of the same doping type, that is n-type or p-type, or may be different to each other. The first concentration and the third concentration may be the same or may be different to each other. The second dopant and the fourth dopant may be the same, may be of the same doping type, that is n-type or p-type, or may be different to each other. The second concentration and the fourth concentration may be the same or may be different to each other. The first dopant, the first concentration, the second dopant, the second concentration, the third dopant, the third concentration, the fourth dopant and the fourth concentration may be chosen that the first flatband voltage and the second flatband voltage differ from each other. By setting the first flatband voltage and the second flatband voltage to differ from each other, different capacitance to voltage relationships of the first capacitor 100 and the second capacitor 120 may be achieved, which when superimposed may be used to obtain a more linear capacitance to voltage relationship or a voltage independent capacitance of the at least two capacitors connected electrically in parallel. The concept is described in more detail in conjunction with FIG. 3.

Figure 2:
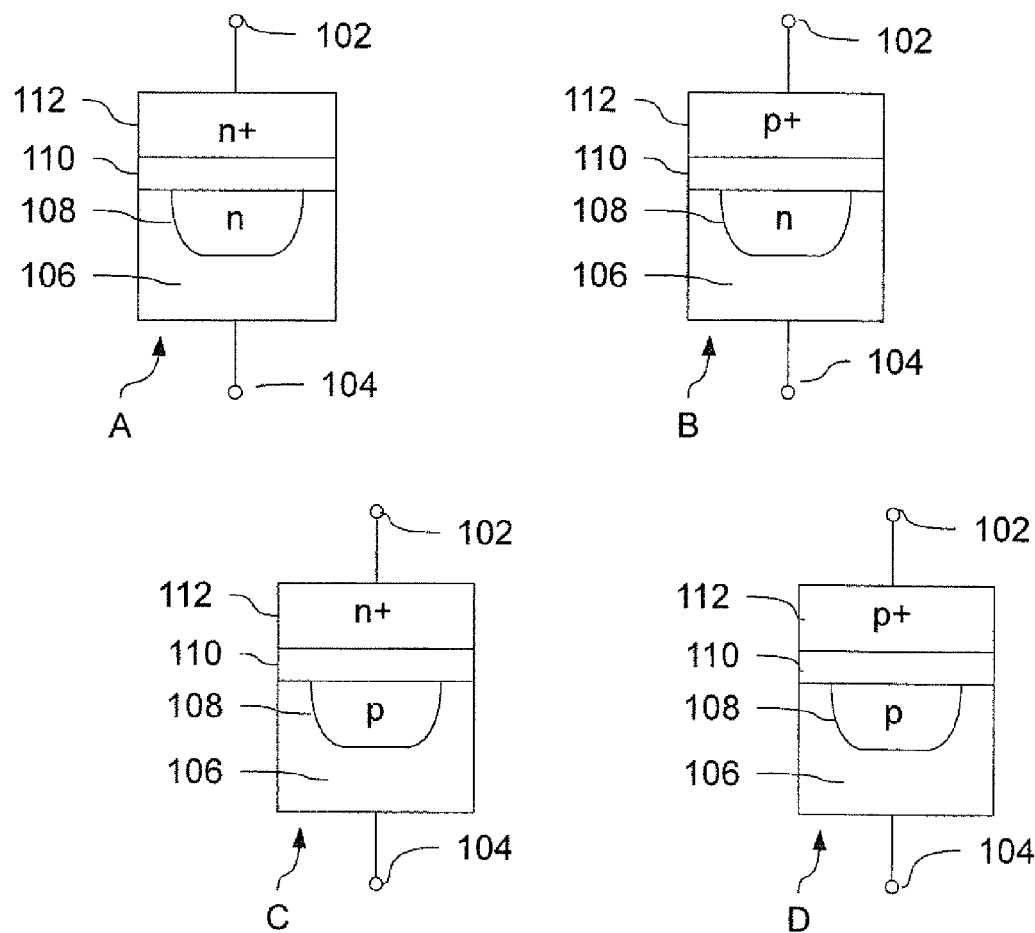
FIG. 2 shows embodiments of capacitors.

FIG. 2 shows four different embodiments of capacitors which are labeled A, B, C and D. The capacitors may correspond to the first capacitor 100 or the second capacitor 120 as they were described in conjunction with the FIG. 1. The reference signs of the first capacitor 100 are used in FIG. 2 and the following description, even though the reference signs of the second capacitor 120 could also be used. The description of FIG. 1 may apply to FIG. 2. The four capacitors A, B, C and D differ from each other by the dopants used in the electrode 112 and the dopant used in the well 108.

In capacitor A, the electrode 112 may be made of polycrystalline silicon and may be heavily doped with a dopant from the group V elements to provide a n+ semiconductor. The first well 108 may be doped with a dopant from the group V elements to provide an n-type doping. Capacitor A has its own capacitance to voltage relationship with its own flatband voltage.

In capacitor B, the electrode 112 may be made of polycrystalline silicon and may be heavily doped with a dopant from the group III elements to provide a p+ semiconductor. The first well 108 may be doped with a dopant from the group V elements to provide an n-type doping. The well 108 may be doped with the same dopant with the same concentration as the well 108 of capacitor A. Capacitor B has its own capacitance to voltage relationship with its own flatband voltage.

In capacitor C, the electrode 112 may be made of polycrystalline silicon and may be heavily doped with a dopant from the group V elements to provide a n+ semiconductor. The electrode 112 may be doped with the same dopant with the same concentration as the electrode of capacitor A. The first well 108 may be doped with a dopant from the group III elements to provide a p-type doping. Capacitor C has its own capacitance to voltage relationship with its own flatband voltage.

In capacitor D, the electrode 112 may be made of polycrystalline silicon and may be heavily doped with a dopant from the group III elements to provide a p+ semiconductor. The electrode 112 may be doped with the same dopant with the same concentration as the electrode of capacitor B. The first well 108 may be doped with a dopant from the group V elements to provide a p-type doping. The first well 108 may be doped with the same dopant with the same concentration as the well 108 of capacitor C. Capacitor D has its own capacitance to voltage relationship with its own flatband voltage. Using the same dopant with the same concentration may simply production of the capacitors A, B, C and D.

The capacitance to voltage relationship of each of the capacitors A, B, C and D as well as their flatband voltages may be chosen to be different from the capacitance to voltage relationship and the flatband voltages of the other capacitors by using different combinations of the dopants in the electrode 112 and the first well 108. Each of the capacitors A, B, C and D may be connected electrically in parallel with one or more of the other capacitors A, B, C and D to provide a capacitor with a capacitance to voltage relationship resulting from the superposition of the individual capacitance to voltage relationships. The individual capacitance to voltage relationships may be chosen so that the desired capacitance to voltage relationship of the at least two electrically parallel connected capacitors is achieved. The desired capacitance to voltage relationship may be a capacitance that is independent of the applied voltage in at least one voltage region. The desired capacitance to voltage relationship may be a capacitance that is linear to the applied voltage in at least one voltage region. In principle, the desired capacitance to voltage relationship may have chosen to be arbitrary and may be achieved by the superposition of the right number of capacitors with the right capacitance to voltage relationships.

Figure 3:
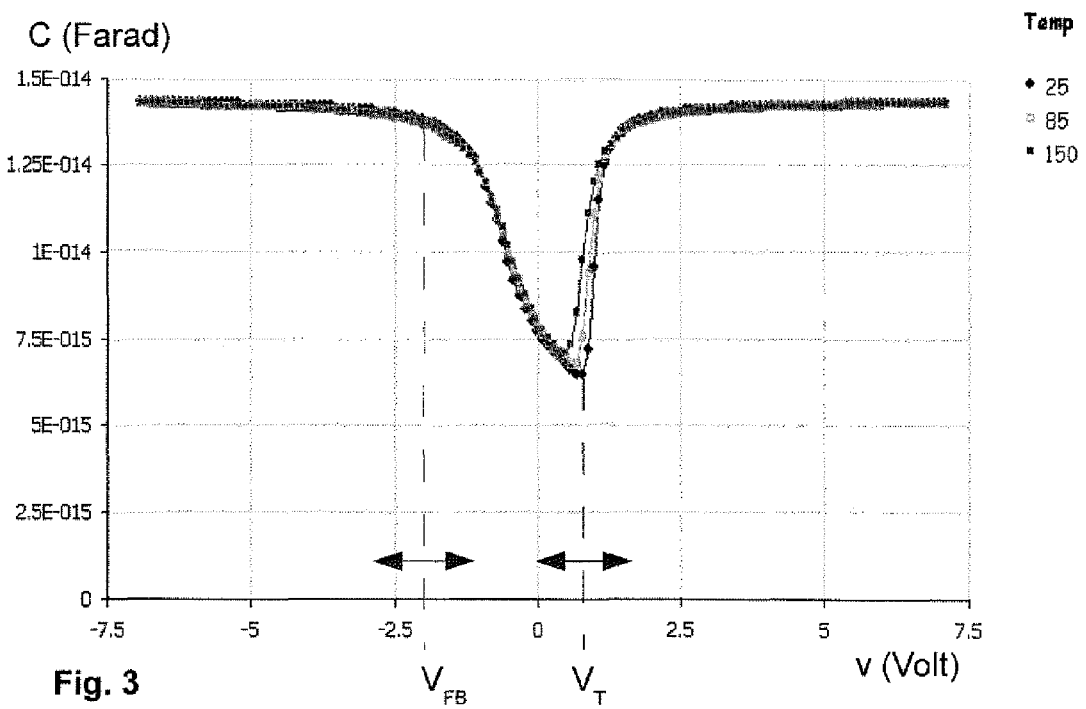
FIG. 3 shows a first capacitance to voltage relationship.

FIG. 3 shows a first capacitance to voltage relationship showing the capacitance C (in Farad) of a capacitor over the voltage v (in Volt) applied to the capacitor. The voltage and the capacitance may be measured between the first terminal 102, 122 and the second terminal 104, 124 and the capacitor may be one as described above in conjunction with FIG. 1 or FIG. 2. The capacitance to voltage relationship may be divided into three distinct regions along the axis showing the voltage. The capacitor is in inversion for voltages less than a flatband voltage $V_{FB}$. The flatband voltage $V_{FB}$ may be about −2.4 V. The capacitor is in depletion for voltages between the flatband voltage $V_{FB}$ and a threshold voltage $V_T$. The threshold voltage $V_T$ may be about 0.4 V. The capacitor is in accumulation for voltages greater than the threshold voltage $V_T$. As may be seen from FIG. 3, the capacitance to voltage relationship is highly nonlinear in the depletion region.

The position of the flatband voltage $V_{FB}$ and the threshold voltage $V_T$ may depend on the dopant and its concentration in the electrode and on the dopant and its concentration in the well, or in the substrate if the capacitor does not need a well. For example, the capacitance to voltage relationship shown in FIG. 3 may correspond to the capacitance to voltage relationship of a capacitor C shown in FIG. 2, with an n+ doped electrode and a p-doped well. Different dopants and different dopant concentrations may lead to different capacitance to voltage relationships.

For example, the capacitance to voltage relationship shown in FIG. 3 may be mirrored along the v=0 axis by using a p+ doped electrode and a n-doped well, such as is used for capacitor B in FIG. 2. In this case, the flatband voltage $V_{FB}$ would be a positive voltage, for example +2.4 V, and the threshold voltage $V_T$ would be a negative voltage, for example −0.4 V.

For example, the capacitance to voltage relationship shown in FIG. 3 may be shifted along the v-axis by an offset of +1 V by using a p+ doped electrode and a p-doped well, such as is used for capacitor D in FIG. 2. In this case, the flatband voltage $V_{FB}$ would be a negative voltage, for example −1.4 V, and the threshold voltage $V_T$ would be a positive voltage, for example 1.4 V.

For example, the capacitance to voltage relationship shown in FIG. 3 may be mirrored along the v=0 axis and may be shifted along the v− axis by an offset of −1 V by using a n+ doped electrode and a n-doped well, such as is used for capacitor A in FIG. 2. In this case, the flatband voltage $V_{FB}$ would be a positive voltage, for example +1.4 V, and the threshold voltage $V_T$ would be a positive voltage, for example −1.4 V.

By electrically connecting a capacitor with a mirrored capacitance to voltage relationship to a capacitor with a non-mirrored capacitance to voltage for relationship in parallel, the asymmetry of each capacitance to voltage relationship about the v=0 axis may be smoothed by the other capacitance to voltage relationship.

Figure 4:
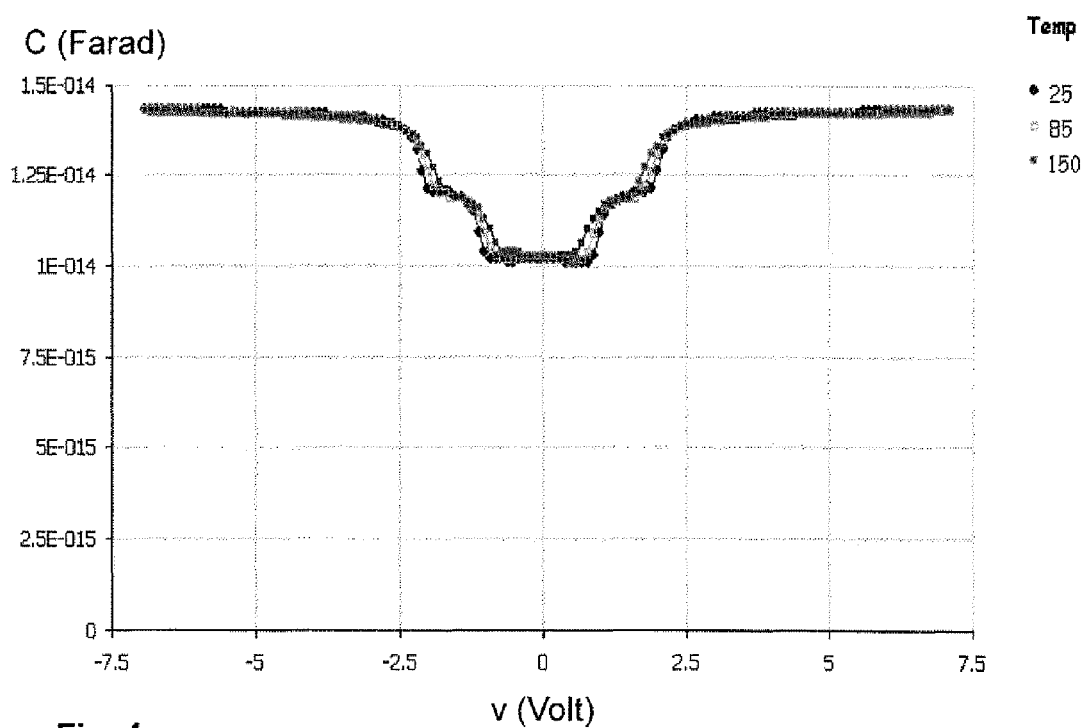
FIG. 4 shows a second capacitance to voltage relationship.

FIG. 4 shows a second capacitance to voltage relationship showing a capacitance C of a capacitor arrangement over the voltage v applied to the capacitor arrangement. The capacitor arrangement may consist of an electrical parallel connection of capacitors, such as the capacitors described above in conjuction with FIG. 1 and FIG. 2, where respective first terminals 102, 122 are connected to each other and respective second terminals 104, 124 are connected to each other. The capacitance to voltage relationships of the individual capacitors are chosen in such a manner that when they are superimposed, the capacitance to voltage relationship shown in FIG. 4 is achieved. The capacitance to voltage relationship shown in FIG. 4 has a flat part, that is a part where the capacitance C is largely independent of the voltage v, in the region of about −0.8 V to +0.8V. The capacitance to voltage relationship shown in FIG. 4 may correspond to a capacitance to voltage relationship of the embodiment of a capacitor arrangement shown in FIG. 7. The capacitance to voltage relationship may be normalized by a device area of the capacitor embodiment.

Figure 5:
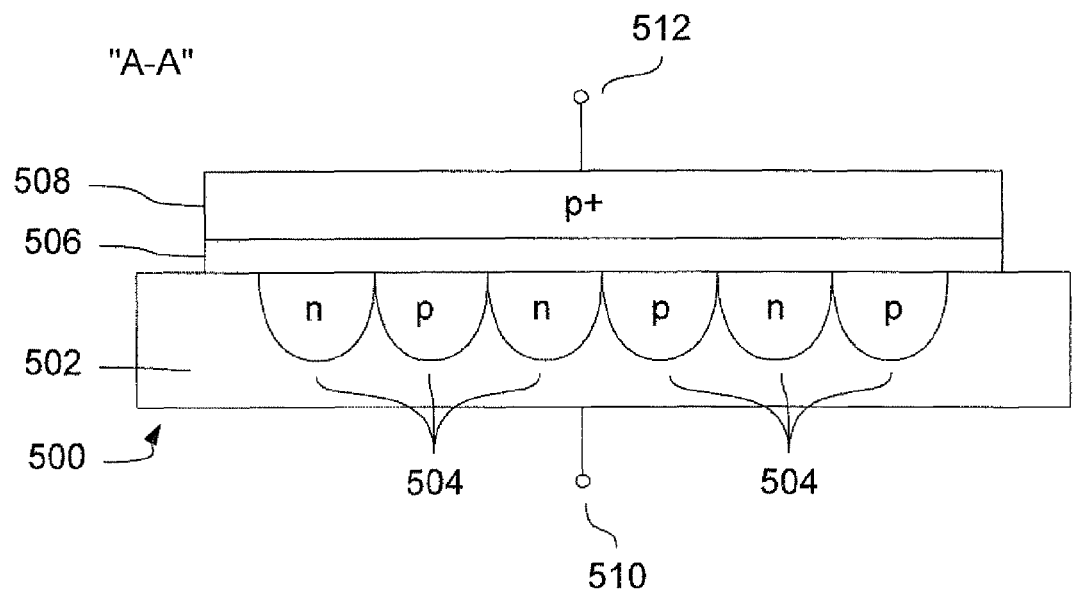
FIG. 5 shows a third embodiment of a capacitor arrangement.

FIG. 5 shows a third embodiment of a capacitor arrangement 500, having a substrate 502; a plurality of wells 504; a dielectric layer 506, an electrode 508, a first terminal 510 and a second terminal 512. The substrate 502 may be a p-type substrate or an n-type substrate. The plurality of wells 504 may be arranged in the substrate 502.

Adjacent wells 504 may have opposite doping types to each other. For example, the leftmost well 504 has an n-type doping and the well 504 that is to its right has a p-type doping. The doping of the next well 504 to the right has again an n-type doping, and so on. The type of doping of adjacent wells 504 may alternate between n-type doping and p-type doping and may be periodic. FIG. 5 shows six wells 504 which are arranged adjacent to one another, however, a different number of wells 504 may be used. FIG. 5 shows an equal number of wells 504 having n-type doping and p-type doping, however, an unequal number of wells 504 having n-type doping and p-type doping is also possible. The leftmost well 504 may have a p-type doping. The wells 504 may have a width of less than 20 μm or less than 5 μm or less than 1 μm. An isolation between the wells 504 is not necessary, however, it may be used. The wells 504 may be arranged directly next to each other, for example, without spacing between them. The first terminal 110 may be electrically coupled to each of the wells 504, for example by means of respective contact holes. The dopants and their concentration may be configured as described above in conjunction with FIG. 1 and FIG. 2. A well may not be necessary where the substrate 502 has the required doping type and dopant concentration.

The dielectric layer 506 may be made from silicon dioxide or silicon nitride or a high-κ dielectric material. The dielectric layer 506 may be arranged on the plurality of wells 504. It may cover the plurality of wells 504, so that surfaces of all the wells 504, which are exposed on a surface of the substrate 502 are covered by the dielectric layer 506. The dielectric layer 506 may also extend over part of the substrate 502. The dielectric layer 506 may be configured as described above in conjunction with FIG. 1 and FIG. 2.

The electrode 508 may be made from polycrystalline silicon. It may be highly doped with a p-type dopant, which is indicated by "p+". It may also be highly doped with an n-type dopant ("n+"). The electrode 508 may be arranged on the dielectric layer 506. It may have the same size or a different size as the dielectric layer 506. It may be arranged over the surfaces of all the wells 504, which are exposed on a surface of the substrate 502. The wells 504, the dielectric layer 506 and the electrode 508 are arranged on top of each other to form capacitors. The electrode 508 may be electrically coupled to the second terminal 512. The electrode 508 may be configured as described above in conjunction with FIG. 1 and FIG. 2.

The capacitor arrangement 500 shown in FIG. 5 may be understood to be an electrical parallel connection of three capacitors B and three capacitors D, where the capacitors B and D were previously described in conjunction with FIG. 2. The capacitors B and capacitors D may be arranged in an alternating manner. The leftmost capacitor may be a capacitor B and next to it may be a capacitor D. To reduce the space required for the capacitor arrangement 500 and to reduce production costs, the three capacitors B and the three capacitors D need not have separate substrates 106, 126 as shown in FIG. 1 but may share a common substrate 502 in which the wells 504 are placed. Similarly, the three capacitors B and the three capacitors D need not have separate dielectric layers 110, 130 but may share a common dielectric layer 506, which is arranged on the wells 504. In the same way, the three capacitors B and the three capacitors D do not need to have separate electrodes 112, 132 but may share a common electrode 508, which is arranged on the common dielectric layer 506. The electrical parallel connection of the six capacitors may be achieved through electrically connecting the wells 504 of each capacitor to each other and by having a common electrode 508 for the capacitors. If the electrode 508 is highly doped with an n-type dopant ("n+"), the capacitor arrangement 500 may be understood to be an electrical parallel connection of three capacitors A and three capacitors C, which were previously described in conjunction with FIG. 2. What has been said about capcitors B and D, may also apply to capacitors A and C.

Figure 6:
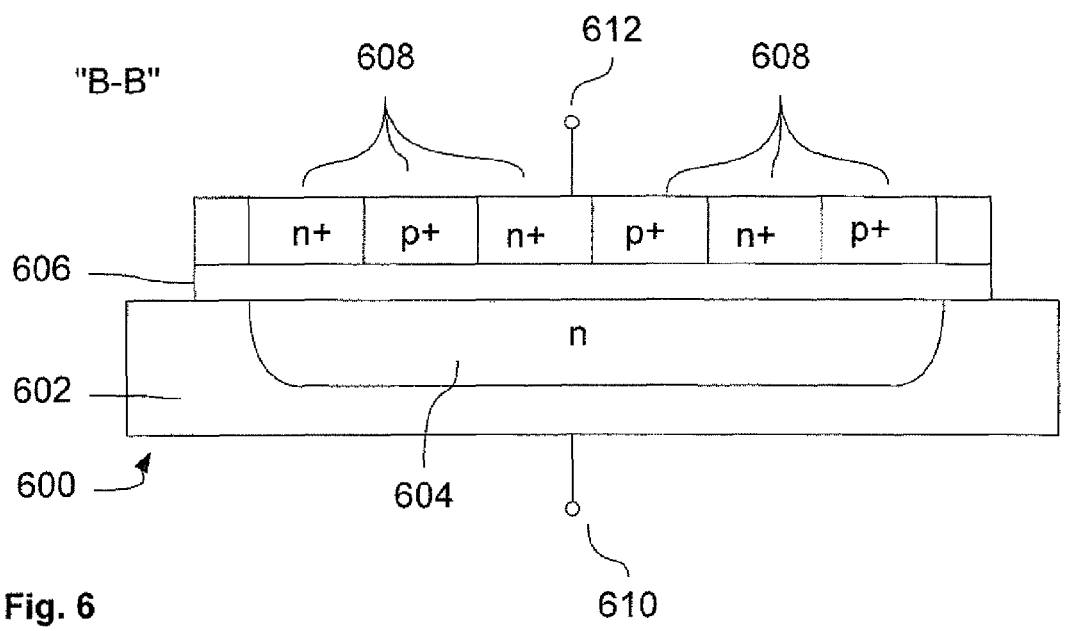
FIG. 6 shows a fourth embodiment of a capacitor arrangement.

FIG. 6 shows a fourth embodiment of a capacitor arrangement 600 having a substrate 602; a well 604; a dielectric layer 606, a plurality of electrodes 608, a first terminal 610 and a second terminal 612. The substrate 602 may be a p-type substrate or an n-type substrate. The well 604 is arranged in the substrate 602. The well 604 may be electrically coupled to the first terminal 610. A well may not be necessary if the substrate 602 has the required doping type and dopant concentration.

The dielectric layer 606 may be made from silicon dioxide or silicon nitride or a high-κ dielectric material. The dielectric layer 606 is arranged on the well 604. It may cover the well 604, so that surface of the well 604, which is exposed on a surface of the substrate 602 is covered by the dielectric layer 606. It may also extend over part of the substrate 602. The dielectric layer 606 may be configured as described above in conjunction with FIG. 1 and FIG. 2.

The plurality of electrodes 608 may be made from polycrystalline silicon. The electrodes 608 may be highly doped with a p-type dopant, which is indicated by "p+" or be highly doped with an n-type dopant, which is indicated by "n+". The plurality of electrodes 608 may be arranged on the dielectric layer 606. The plurality of electrodes 608 may have the same size or a different size as the dielectric layer 606. It may be arranged over the surface of the well 604, which is exposed on a surface of the substrate 602. The well 604, the dielectric layer 606 and the plurality of electrodes 608 are arranged on top of each other to form capacitors.

Adjacent electrodes 608 may have opposite doping types to each other. For example, the leftmost electrode 608 has a n+ doping and the electrode 608 that is to its right has a p+ doping. The doping of the next electrode 608 to the right has again a n+ doping, and so on. The type of doping of adjacent electrodes 608 may alternate between n+ doping and p+ doping and may be periodic. FIG. 6 shows six electrodes 608 which are arranged adjacent to one another, however, a different number of electrodes 608 may be used. FIG. 6 shows an equal number of electrodes 608 having n+ doping and p+ doping, however, an unequal number of electrodes 608 having n+ doping and p+ doping is also possible. The leftmost electrode 608 may have a p+ doping. The electrodes 608 may have a width of less than 20 μm or less than 5 μm or less than 1 μm. An isolation between the electrodes 608 is not necessary, however, it may be used. The electrodes 608 may be arranged directly next to each other, for example, without spacing between them. The second terminal 612 may be electrically coupled to each of the electrodes 608, for example by means of respective contact holes. The electrodes of the plurality of electrodes 608 may be configured as described above in conjunction with FIG. 1 and FIG. 2.

The capacitor arrangement 600 shown in FIG. 6 may be understood to be an electrical parallel connection of three capacitors A and three capacitors B, where the capacitors A and B were previously described in conjunction with FIG. 2. The capacitors A and capacitors B may be arranged in an alternating manner. The leftmost capacitor may be a capacitor A and next to it may be a capacitor B. To reduce the space required for the capacitor arrangement 600 and to reduce production costs, the three capacitors A and the three capacitors B need not have separate substrates 106, 126 as shown in FIG. 1 but may share a common substrate 602. Similarly, the three capacitors A and the three capacitors B need not have separate wells 108, 128 but may share a common well 604. In the same way, the three capacitors A and the three capacitors B need not have separate dielectric layers 110, 130 but may share a common dielectric layer 606. The electrical parallel connection of the six capacitors may be achieved through connecting the electrodes 608 to each other and by having a common well 604. If the well 604 is doped with a p-type dopant, the capacitor arrangement 600 may be understood to be an electrical parallel connection of three capacitors C and three capacitors D, which were previously described in conjunction with FIG. 2. What has been said about capacitors A and B, may also apply to capacitors C and D.

Figure 7:
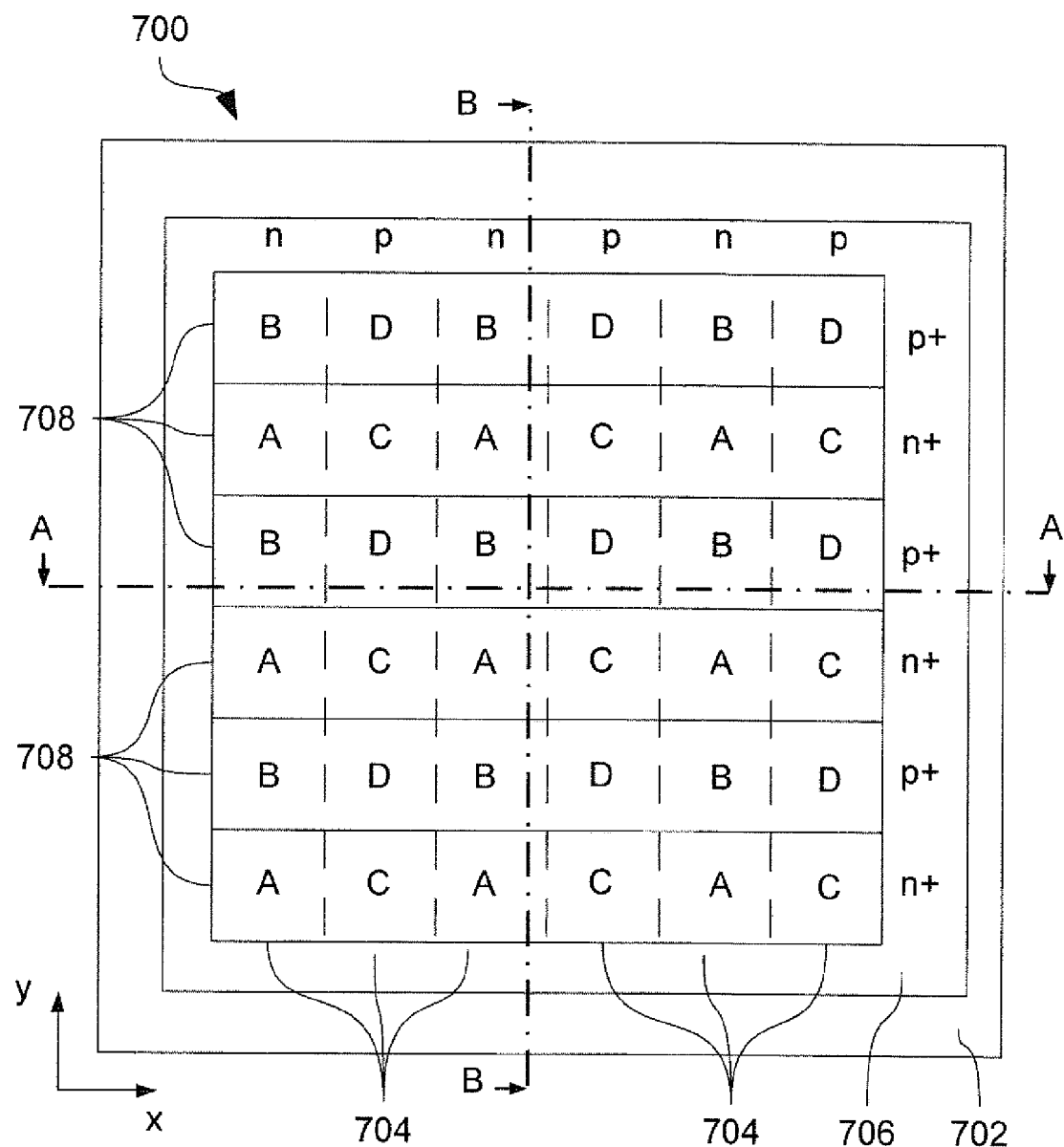
FIG. 7 shows a fifth embodiment of a capacitor arrangement.

FIG. 7 shows a top view of a fifth embodiment of a capacitor arrangement 700 having a substrate 702, a plurality of wells 704, a dielectric layer 706, a plurality of electrodes 708, and a first terminal (not shown) and a second terminal (not shown). The substrate 702 may be a p-type substrate or an n-type substrate. The plurality of wells 704 may be arranged in the substrate 702.

The plurality of wells 704 may be arranged adjacent to each other as columns in the substrate 702. The columns may run along the direction of the Y-axis. A possible cross-section through a column of the capacitor arrangement 700 along the lines B-B is shown in FIG. 6. Each column may have a well 704 with one type of dopant. Wells 704 that are adjacent to one another may have opposite doping types. The doping type of each well 704 is indicated in FIG. 7 by the sequence "n p n p n p", where "n" represents a well 704 with n-type doping and "p" represents a well 704 with p-type doping. For example, the leftmost well 704 has an n-type doping and the well 704 that is to its right has a p-type doping. The doping of the next well 704 to the right has again an n-type doping, and so on. The type of doping of adjacent wells 704 may alternate between n-type doping and p-type doping and may be periodic. FIG. 7 shows six wells 704 which are adjacent to one another, however, a different number of wells 704 may be used. FIG. 7 shows an equal number of wells 704 having n-type doping and p-type doping, however, an unequal number of wells 704 having n-type doping and p-type doping is also possible. The leftmost well 704 may have a p-type doping. The wells 704 may have a width of less than 20 μm or less than 5 μm or less than 1 μm. An isolation between the wells 704 is not necessary, however, it may be used. The wells 704 may be arranged directly next to each other, for example, without spacing between them. The first terminal may be electrically coupled to each of the wells 704, for example by means of respective contact holes. The dopants and their concentration may be configured as described above in conjunction with FIG. 1 and FIG. 2. A well may not be necessary where the substrate 702 has the required doping type and dopant concentration.

The dielectric layer 706 may be made from silicon dioxide or silicon nitride or a high-κ dielectric. The dielectric layer 706 may be arranged on the plurality of wells 704. It may cover the plurality of wells 504, so that surfaces of all the wells 504, which are exposed on a surface of the substrate 502 are covered by the dielectric layer 506. It may also extend over part of the substrate 702. The dielectric layer 506 may be configured as described above in conjunction with FIG. 1 and FIG. 2.

The plurality of electrodes 708 may be made from polycrystalline silicon. It may be arranged on the dielectric layer 706. It may have the same size or a different size as the dielectric layer 706. The electrodes 708 may be arranged adjacent to each other as rows on the dielectric layer 706. The rows may run along the direction of the X-axis. A possible cross-section through a row of the capacitor arrangement 700 along the lines A-A is shown in FIG. 5. Each row may have an electrode 708 with one type of dopant. Electrodes 708 that are adjacent to one another may have opposite doping types. The doping type of each electrode 708 is indicated in FIG. 7 by the sequence "p+n+p+n+p+n+", where "n+" represents an electrode 708 with a heavy n-type doping and "p+" represents an electrode 708 with a heavy p-type doping. For example, the bottommost electrode 708 may have a n+ doping and the electrode 708 that is above, that is towards the top of the page, to it may have a p+ doping. The doping of the next electrode 708 to the top has again an n+ doping, and so on. FIG. 7 shows six electrodes 708 which are adjacent to one another, however, a different number of electrodes 708 may be used. FIG. 7 shows an equal number of electrodes 708 having n+ doping and p+ doping, however, an unequal number of electrodes 708 having n+ doping and p+ doping is also possible. The bottommost electrode 708 may have a p+ doping. The electrode 708 may have a width of less than 20 μm or less than 5 μm or less than 1 μm. An isolation between the electrodes 708 is not necessary, however, it may be used. The electrodes 708 may be arranged directly next to each other, for example, without spacing between them. The second terminal may be electrically coupled to each of the electrode 708, for example by means of respective contact holes. The electrodes of the plurality of electrodes 708 may be configured as described above in conjunction with FIG. 1 and FIG. 2.

The capacitor arrangement 700 shown in FIG. 7 may be understood to be an electrical parallel connection of 36 capacitors with nine capacitors A, nine capacitors B, nine capacitors C and nine capacitors D, where the different capacitors are illustrated in FIG. 2. The capacitors may be arranged in a chessboard pattern and be specified by the letters A, B, C and D. If the rows are numbered in a positive direction of the Y-axis and the columns are numbered in a positive direction of the X-axis, the capacitor arrangement 700 may be described as follows: In rows with an odd number, such as 1, 3 and 5, with the bottommost row being number 1, capacitors A and capacitors C alternate along the direction of the X axis. In rows with an even number, such as 2, 4 and 6, with the top most row being number 6, capacitors B and capacitors D alternate along the direction of the X axis. In columns with an odd number, such as 1, 3 and 5, with the leftmost column being number 1, capacitors A and capacitors B alternate along the direction of the Y axis. In columns with an even number, such as 2, 4 and 6, with the rightmost column being number 6, capacitors C and capacitors D alternate along the direction of the Y axis. The alternation of the doping of the columns and rows may be periodic. The capacitors may also be arranged in different patterns. The numbers of capacitors A, capacitors B, capacitors C and capacitors D may be different.

To reduce the space required for the capacitor arrangement 700 and to reduce production costs, the 36 capacitors need not each have separate substrates 106, 126 as shown in FIG. 1 but may share a common substrate 702. With the same objective, the 36 capacitors need not each have separate dielectric layers 110, 130 as shown in FIG. 1, but may share a common dielectric layer 706. Similarly, the capacitors arranged along rows need not have separate electrodes 112, 132 as shown in FIG. 1 but may share a common electrode 708 for each row. Similarly, capacitors arranged along columns need not have separate wells 108, 128 as shown in FIG. 1, but may share a common well 704 for each column. An isolation between the wells 704 or between the electrodes 708 is not needed, which may also reduce the space required for the capacitor arrangement 700. However, it is possible to provide isolation between the capacitors, for example by shallow trench isolation. The capacitors may be arranged directly next to each other, for example, without spacing between them. The electrical parallel connection of the 36 capacitors is achieved by connecting the wells 704 of the columns to each other and by connecting the electrodes 708 of the rows to each other. The four different capacitors A, B, C and D used in the capacitor arrangement 700 provide four different capacitance to voltage relationships, which may be superimposed to obtain the desired capacitance to voltage relationship, for example, as is shown in FIG. 4. Capacitors which are different from the capacitors A, B, C and D may also be used.

The columns and the rows may be arranged to be orthogonal to each other. Orthogonal is chosen to mean the columns and the rows may be arranged uncorrelated or independent from one another, for example, by arranging the columns along the direction of an axis, such as the Y-axis and by arranging the rows along the direction of another axis, such as the X-axis, where the axises are orthogonal to each other, for example by having directions that are at 90° to each other. If the columns and the rows are arranged orthogonal to each other, masks for the layout of the wells 704 and the electrodes 708 may be positioned independently from each other. The requirements for the precision of the layout and of the production processes may be reduced.

The embodiments of capacitor arrangement may be implemented using complementary metal oxide semiconductor (CMOS)-logic circuit production processes. A dual work function production process may be used, for example for producing electrodes with n+ and p+ doping.

The capacity of the embodiments of the capacitor arrangement may be chosen by the number of capacitors connected in parallel. An embodiment of the capacitor arrangement may, for example have 100 columns and 100 rows, with a total of 10,000 capacitors. The capacitor arrangement may be used in any kind of electrical application.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A capacitor arrangement, comprising:
a doped region having an n-type doping or a p-type doping;
a dielectric layer disposed over the doped region;
a plurality of electrodes, wherein the electrodes are arranged next to each other and disposed over the dielectric layer, wherein respectively adjacent electrodes have opposite doping types to each other; and
a first terminal, wherein the first terminal is electrically coupled to the doped region; and
a second terminal, wherein the second terminal is electrically coupled to each electrode of the plurality of electrodes.

2. The capacitor arrangement of claim 1,
wherein the doped region is configured as a well.

3. The capacitor arrangement of claim 1,
wherein the doping type is an n doping type or a p doping type.

4. The capacitor arrangement of claim 1,
wherein the dielectric layer comprises at least one of the following materials:
silicon dioxide;
silicon nitride; and
a high-κ dielectric.

5. The capacitor arrangement of claim 1,
wherein the electrode comprises polycrystalline silicon.

6. The capacitor arrangement of claim 1,
wherein the electrodes have a respective width of less than 20 μm.

7. A capacitor arrangement, comprising:
a substrate;
a plurality of wells, wherein the wells are arranged as columns in the substrate,
wherein adjacent wells have opposite doping types;
a dielectric layer, wherein the dielectric layer is disposed over the plurality of wells;
a plurality of electrodes, wherein the electrodes are arranged as rows on at least a region of the dielectric layer that is disposed over the plurality of wells, wherein adjacent electrodes have opposite doping types; and
a first terminal, wherein the first terminal is electrically coupled to each well of the plurality of wells; and
a second terminal, wherein the second terminal is electrically coupled to each electrode of the plurality of electrodes.

8. The capacitor arrangement of claim 7,
wherein the doping type is an n doping type or a p doping type.

9. The capacitor arrangement of claim 7,
wherein the columns and the rows are arranged orthogonal to each other.

10. The capacitor arrangement of claim 7,
wherein the dielectric layer comprises at least one of the following materials:
silicon dioxide;
silicon nitride; and
a high-κ dielectric.

11. The capacitor arrangement of claim 7,
wherein the electrode comprises polycrystalline silicon.

12. The capacitor arrangement of claim 7,
wherein the rows have a width of less than 20 μm.

13. The capacitor arrangement of claim 12,
wherein the columns have a width of less than 20 μm.

* * * * *